United States Patent [19]

Rosenthal

[11] Patent Number: 5,430,670
[45] Date of Patent: Jul. 4, 1995

[54] DIFFERENTIAL ANALOG MEMORY CELL AND METHOD FOR ADJUSTING SAME

[75] Inventor: Bruce D. Rosenthal, Los Gatos, Calif.

[73] Assignee: Elantec, Inc., Milpitas, Calif.

[21] Appl. No.: 148,297

[22] Filed: Nov. 8, 1993

[51] Int. Cl.$^6$ ............................................. G11C 27/00
[52] U.S. Cl. ........................................ 365/45; 365/149; 365/182; 365/207; 365/185; 257/312
[58] Field of Search ................. 365/45, 185, 207, 182, 365/189.09, 102, 149; 257/312, 315

[56] References Cited

U.S. PATENT DOCUMENTS

| | | | |
|---|---|---|---|
| 4,054,864 | 10/1977 | Audaire et al. | 365/45 |
| 4,094,007 | 6/1978 | Minami | 365/45 |
| 5,027,171 | 6/1991 | Reedy et al. | 365/182 |
| 5,253,196 | 10/1993 | Shimabukuro | 365/45 |

OTHER PUBLICATIONS

Anikumar P. Thakoor and Alexander W. Moopenn, "Stacked-Gate FET's for Analog Memory Elements," NASA Tech Briefs, Jul. 1991, p. 16.

Tong-Chern Ong, Ping K. Ko, and Chenming Hu, "The EEPROM as an Analog Memory Device," IEEE Transactions on Electron Devices, vol. 36, No. 9, Sep. 1989, pp. 1840–1841.

R. L. Shimabukuro, R. E. Reedy, G. A. Garcia, "Dual Polarity Nonvolatile MOS Analogue Memory (MAM) Cell for Neural-Type Circuitry" Electronic Letters, vol. 24, No. 19, Sep. 15, 1988, pp. 1231–1232.

Axel Thomsen and Martin A. Brooke, "A Floating-Gate MOSFET with Tunneling Injector Fabricated Using a Standard Double-Polysilicon CMOS Process," IEEE Electron Device Letters, vol. 12, No. 3, Mar. 1991, pp. 111–113.

R. L. Shimabukuro, P. A. Shoemaker, M. E. Stewart, "Circuitry for Artificial Neural Networks with Non-Volatile Analog Memories," Proceedings, 1989 IEEE International Symposium on Circuits and Systems, Portland, Oreg., vol. 2, May 1989, pp. 1217–1220.

L. Richard Carley, "Trimming Analog Circuits Using Floating-Gate Analog MOS Memory," IEEE Journal of Solid-State Circuits, vol. 24, No. 6, Dec. 1989, pp. 1569–1575.

A. Thakoor, A. Moopenn, "Stacked-Gate FET's for Analog Memory Elements," National Aeronautics and Space Administration Contract No. NAS 7-918, NASA Tech Brief, vol. 15, No. 7, Item #153 from JPL Invention Report NPO-17626/7124, Jul. 1991.

Avinoam Kolodny, Sidney T. K. Nieh, Boaz Eitan, Joseph Shappir, "Analysis and Modeling of Floating-Gate EEPROM Cells," IEEE Transactions on Electron Devices, vol. ED-33, No. 6, Jun. 1986, pp. 835–844.

Based on the work of R. L. Shimabukuro, "Navy Invents Dual Polarity Non-Volatile MOS Analog Memory Cells", Navy Domestic Technology Transfer Fact Sheet, Article No. 150103, vol. 15, No. 1, Item 3, Jan. 1990.

David H. K. Hoe, Kenneth J. Schultz, C. Andre T. Salama, Robert A. Hadaway, Paul Kempf, "Cell and Circuit Design for Single-Poly EPROM", IEEE Journal of Solid-State Circuits, vol. 24, No. 4, Aug. 1989, pp. 1153–1157.

*Primary Examiner*—Joseph A. Popek
*Assistant Examiner*—Tan Nguyen
*Attorney, Agent, or Firm*—Leo V. Novakoski; Albert C. Smith

[57] ABSTRACT

A differential analog memory cell provides output signals governed by precisely adjustable voltage levels having minimal drift. The memory cell comprises a pair of differentially connected floating gate MOSFETs, each MOSFET having its source connected to a common current source and its drain connected to one leg of a current mirror. The floating gate of each MOSFET is connected to one electrode of a tunneling capacitor and one electrode of a coupling capacitor. Voltages applied to the other electrode of the tunneling capacitor inject charges onto the corresponding floating gate, the voltage of which is determined by the size of the coupling capacitor. Output voltages taken from the drains of the floating gate MOSFETs can be precisely adjusted up or down by applying single polarity voltage pulses to one or the other injector nodes.

15 Claims, 5 Drawing Sheets

DIFFERENTIAL ANALOG MEMORY CELL AND METHOD FOR ADJUSTING SAME

Technical Field

This invention relates to the field of analog memory devices, and in particular to differential analog memory devices and methods for precisely adjusting the voltages stored on such devices.

BACKGROUND OF THE INVENTION

The use of floating gate Metal Oxide Semiconductor (MOS) devices for storing digital signals is well known. Digital devices such as Electronically Programmable Read Only Memory (EPROM) and Erasable Electronically Programmable Read Only Memory (EEPROM) devices need only generate voltages falling within one of two ranges, each of which corresponds to one of two digital logic levels. Floating gate MOS devices may also be used as analog memory devices in amplifiers, comparators, voltage standards, A/D converters, and D/A converters. For precision versions of these devices, it may be necessary to establish analog voltages with an accuracy of 0.1%. Thus, there is a need for analog circuits in which voltage levels can be adjusted with the requisite precision.

One application for which precision analog memory devices are essential is in trimming voltage offsets in MOS based operational amplifiers, where device mismatches can be substantial. These operational amplifiers typically comprise a pair of differentially connected MOS Field Effect Transistors (MOSFET) with an active drain load such as a current mirror. One method of correcting the voltage offset between the differential MOSFET pair is to connect a floating gate MOS device in parallel with a transistor of a current mirror load. With the gates of the differential MOSFET pair shorted, the voltage of the floating gate is adjusted to shunt more or less current through the MOS device. This is accomplished by monitoring the output of the operational amplifier while the charge on the floating gate of the MOS device is adjusted by means of Fowler Nordheim tunneling. Charge adjustment of the MOS device continues until the voltage at the output of the operational amplifier swings to mid-supply.

The use of single floating gate MOS devices to trim voltage offsets in MOS based operational amplifiers has a number of shortcomings. For example, the voltage-current relationships that govern the injection of electrons onto and removal of electrons from the floating gate are not symmetric about zero voltage. Thus, the magnitude of the voltages necessary to initiate charge transfer to and from the gate are different and produce different charge transfer rates as a function of the magnitude of the applied voltage. In addition, the voltage of the floating gate is subject to short term drift following charge transfer to or from the gate, with the gate voltage drifting back towards its original value over a period of several minutes. This drift can be reduced by making smaller changes in the voltage of the floating gate. However, this lengthens the period of time necessary to adjust the gate voltage to the desired level. Further, a single MOS memory device only adjusts drain current from one of the differentially connected MOSFETs. Consequently, the differential amplifier circuit must be designed so that the voltage offset will always occur in a specific direction. This may be done for example by selecting devices of different sizes for use in the circuit.

SUMMARY OF THE INVENTION

The present invention is a differential analog memory (DAM) cell that provides precisely adjustable analog voltages having reduced short term drift. The differential analog memory cell comprises a pair of differentially connected floating gate MOSFET devices, means for injecting charge onto the floating gates of the MOSFETs, and a pair of coupling capacitors connected to the floating gates of the MOSFETs for controlling the relative gate voltage. The differential voltage between the floating gate MOSFETs is increased or decreased by applying tunneling voltages of the same polarity to one or the other charge injecting means, eliminating complications due to the polarity dependence of the current-voltage characteristics of the charge injecting means. The differential structure of the DAM cell also minimizes the effects of short term drift on the output voltage, and its output may be used in differential or single ended form, depending on the use to which the DAM cell is directed. The injection means may be a pair of injection capacitors for introducing charge via Fowler Nordheim tunneling, or a second pair of MOSFETs for injecting hot electrons.

DAM cells in accordance with the present invention may be used to adjust bias levels or correct voltage offsets due to device mismatches. In one embodiment, a DAM cell is included in a differential amplifier, connected to an active load in parallel with the differential input stage of the amplifier. Offsets due to mismatches between the MOSFET devices of the differential input stage are trimmed by shorting the amplifier inputs together and precisely adjusting the charges on the floating gates of the DAM cell MOSFETs until the output voltage of the amplifier is at a balance point midway between the supply voltages. To do so, the output voltage of the operational amplifier with its inverting and non-inverting inputs shorted together is sensed, the floating gate MOSFET of the DAM cell to be adjusted is determined, and a series of voltage pulses are applied to the floating gate of this MOSFET until the output voltage crosses the balance point. Once the output voltage crosses the balance point, a voltage pulse is applied to the floating gate of the other DAM cell MOSFET to readjust the output voltage back toward the balance point. The precision with which this algorithm eliminates the voltage offset can be improved by decreasing the size of the voltage pulses as the amplifier output approaches the balance point.

DETAILED DISCUSSION OF THE INVENTION

Figure 1A:
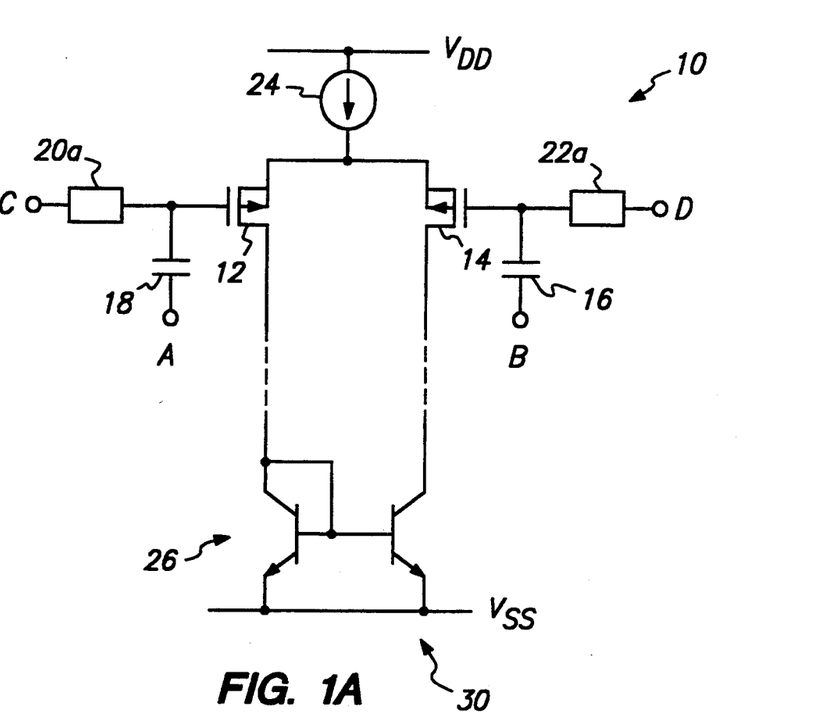
FIG. 1A is a schematic drawing of a DAM cell in accordance with the present invention.

Referring to FIG. 1A, there is shown a differential analog memory (DAM) cell 10 in accordance with the present invention. A pair of differentially connected MOSFETs 12, 14 each of which has a floating gate, have their sources connected together and to a voltage supply $V_{DD}$ through a current source 24. The floating gate of MOSFET 12 is connected to one electrode of a charge injector 20a, the other electrode of which is coupled to a node C. The floating gate of MOSFET 12 is also coupled to one electrode of a coupling capacitor 18, the other electrode of which is connected to a node A. Similarly, the floating gate of MOSFET 14 is connected to one electrode of charge injector 22a and to one electrode of coupling capacitor 16. The second electrodes of charge injector 22a and coupling capacitor 16 form nodes D and B, respectively.

Figure 1B:
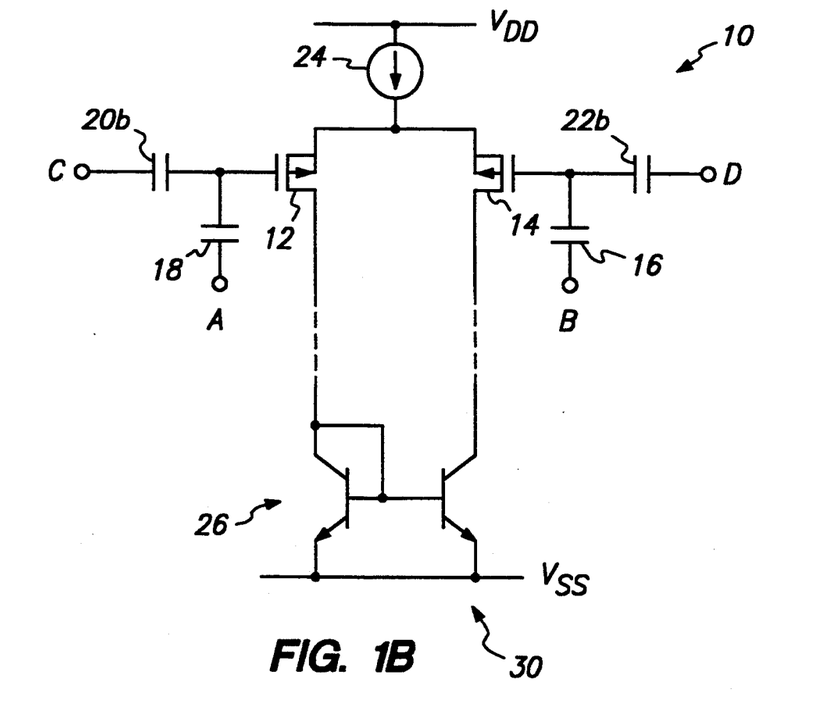
Fig. 1B is a schematic drawing of a DAM cell in accordance with the present invention in which the injection means are a pair of tunneling capacitors.

Injectors 20a, 22a represent devices that transmit charges across an MOS interface in response to an applied voltage. For example, injectors 20a, 22a may be tunneling capacitors 20b, 22b, which inject electrons by Fowler-Nordheim tunneling, or floating gate MOSFETs 20c, 22c, for avalanche injection of "hot electrons". Referring now to FIG. 1B, there is shown a DAM cell 10 in which charge injection is accomplished by means of tunneling capacitors 20b, 22b. In this case, a voltage sufficient to induce tunneling in tunneling capacitor 20b or 22b is applied to node C or D, respectively, inducing charge to flow onto the floating gate of MOSFET 12 or MOSFET 14, respectively. The voltage above which tunneling current flows is determined by the semiconductor material and the oxide layer of tunneling capacitors 20b, 22b. For a DAM cell 10 based on NMOS devices, the voltage applied to nodes C, D is decreased to induce tunneling.

Figure 1C:
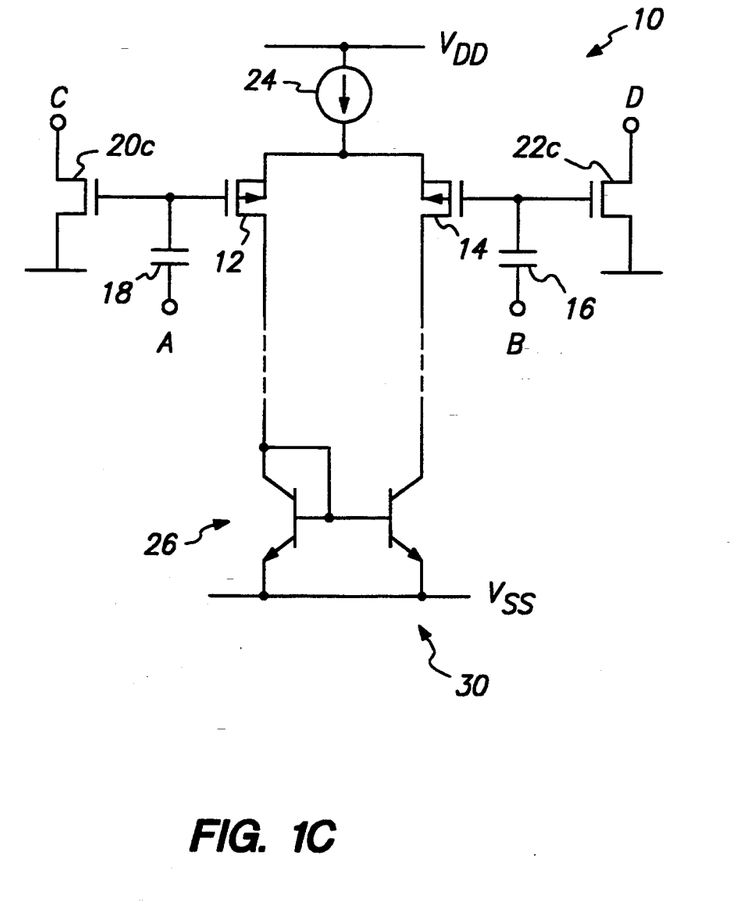
FIG. 1C is a schematic drawing of a DAM cell in accordance with the present invention in which the injection means is a pair of MOSFETs.

Referring now to FIG. 1 C, there is shown a DAM cell 10 in which charge injection is accomplished by means of a second pair of floating gate MOSFETs 20c, 22c. The drains of MOSFETs 20c, 22c form nodes C and D, and their floating gates are connected to the floating gates of MOSFETs 12, 14. Charge is transferred to the floating gates of MOSFETs 12, 14 by avalanche injection when the voltages at nodes C and D, respectively, are increased above a threshold level.

DAM cell 10 distributes current from current source 24 between the drains of MOSFETs 12, 14 according to the charges on their floating gates, and these charges may be precisely adjusted by means of charge injectors 20a, 22a according to the voltages applied to injector nodes C, D, respectively. For example, for Fowler-Nordheim tunneling, electrons can be injected onto the gate of MOSFET 12 by bringing the voltage of injector node C above the threshold voltage for tunneling capacitor 20b. The magnitude of the voltage applied to node C determines the tunneling current, $I_t$, through tunneling capacitor 20b, and the time, $\Delta t$, for which the voltage is applied to node C determines the total charge transferred to the floating gate of MOSFET 12. The resulting change in the voltage of the floating gate is given by:

$$\Delta V_g = I_t \Delta t / C_t$$

where $C_t$ is capacitance of tunneling capacitor 18. Thus, for a tunneling current on the order of 1 fA into a capacitive load on the order of 1 fF, the gate voltage is adjusted at a rate of 1 volt per second. Under these circumstances, voltage adjustments on the order of a millivolts can be accomplished in a millisecond. In the same manner, bringing the voltage of node D above the threshold voltage of tunneling capacitor 22b transfers charge to the floating gate of MOSFET 14, increasing its drain current in accordance with the size of coupling capacitor 16. However, in this case the change in the differential output of DAM cell 10 is in the opposite direction. In the preferred embodiment of DAM cell 10, coupling capacitors 16, 18 are selected to be several times larger than tunneling capacitors 20, 22. As indicated, nodes A and B are connected to $V_{DD}$ through diodes 17, 15, respectively. By grounding nodes A and B, the gates of MOSFETs 12, 14 can be reset.

Also shown in FIGS. 1A, 1B, IC is an optional current mirror 26, the inputs of which are connected to the drains of MOSFETs 12, 14 to convert DAM cell 10 into a differential amplifier 30. With this configuration, the current distributed between MOSFETs 12, 14 is converted to a differential output voltage between the drains of MOSFETs 12, 14. This differential voltage may be used to adjust differential voltages in other circuits, or converted to a single ended signal. In either case, the precision of the resulting voltage adjustment is determined by the charge coupled to the floating gates of MOSFETs 12, 14 via charge injectors 20, 22 and by the capacitance of coupling capacitors 18, 16.

The differential structure of DAM cell 10 allows the output voltage of differential amplifier 30 or the output current of DAM cell 10 to be adjusted up or down by applying a positive voltage at node C or D. Where DAM cell 10 is composed of PMOS devices, a negative voltage is used to adjust the output. Thus, for a given DAM cell 10 the tunneling voltages always have the same sign, whether the output signal of DAM cell 10 is to be increased or decreased. Consequently, the performance of DAM cell 10 is not affected by differences in current-voltage characteristics of injectors 20a, 22a for positive and negative voltages. The differential structure of DAM cell 10 also minimizes the effects of drift in gate voltages of MOSFETs 12, 14 on the performance of DAM cell 10. The floating gates of both MOSFETs 12, 14 are typically adjusted on a time scale of less than 100 milliseconds, while the drift in gate voltages occurs over a few minutes. As a result, the drift in gate voltages contributes only to the common mode voltage change in MOSFETs 12, 14, and its effect on the differential output of DAM cell 10 will be negligible.

These features of DAM cell 10 make it suitable for adjusting bias levels and correcting voltage offsets in precision analog devices. By integrating a DAM cell 10 into a host circuit, the requisite voltage precision can be obtained by applying voltage pulses to a injector nodes C, D while monitoring the critical voltage level in the host circuit. For example, a DAM cell 10 can be added to an operational amplifier to eliminate offset voltages due to device mismatches.

Figure 2:
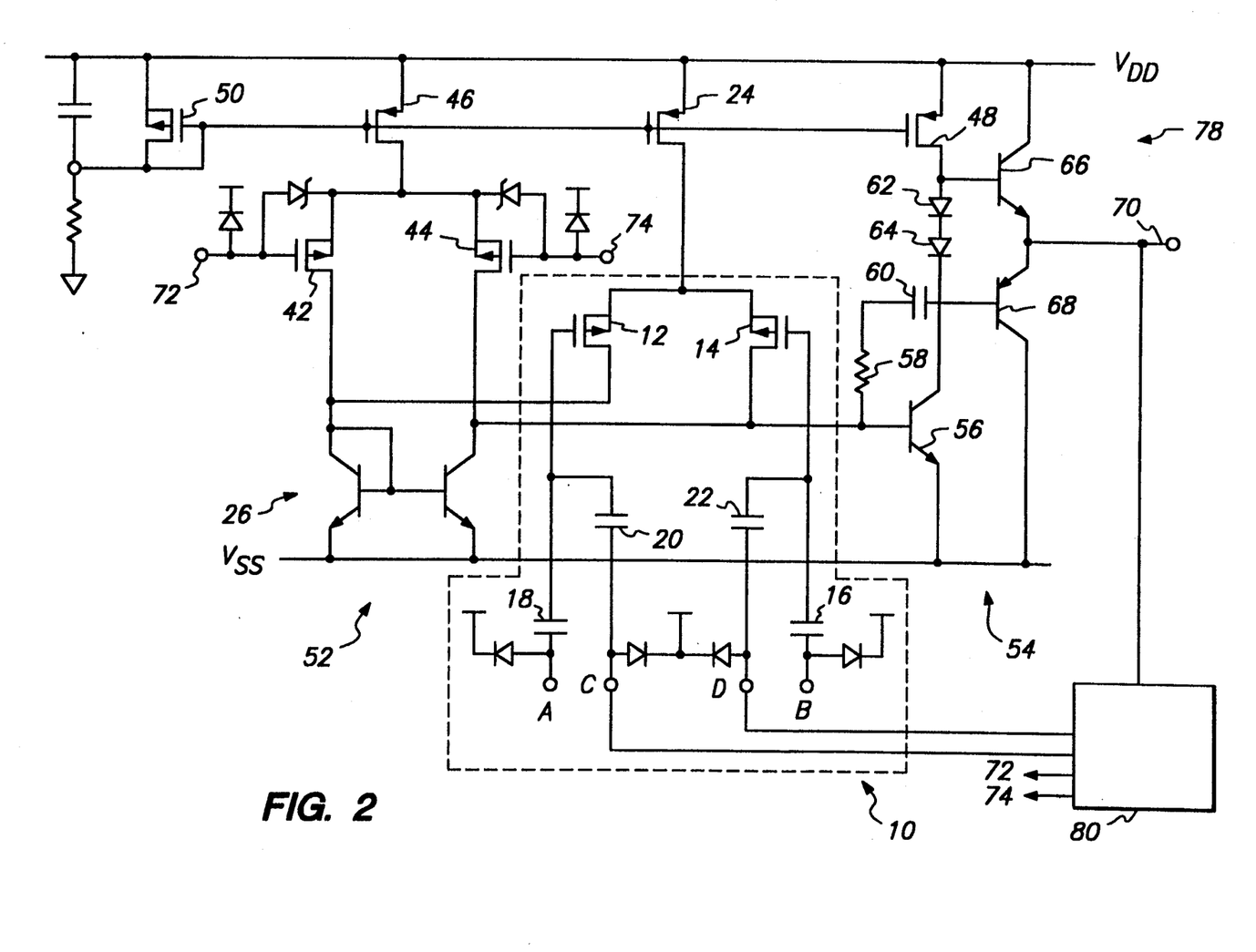
FIG. 2 is a schematic diagram of an operational amplifier, including a DAM cell in accordance with the present invention.

Referring now to FIG. 2, there is shown a schematic diagram of an operational amplifier 40, which includes a DAM cell 10 in accordance with the present invention to correct the offset in amplifier output 70. Operational amplifier 40 has an input stage 52 comprising a pair of differentially connected MOSFETs 42, 44. MOSFETs 42, 44 have their sources connected to each other and to voltage supply $V_{DD}$ by means of current source 46. The drains of MOSFETs 42, 44 are connected to current mirror 26 in parallel with the drains of DAM cell MOSFETs 12, 14, and the gates of MOSFETs 42, 44 form inverting input 72 and non-inverting input 74, respectively, of operational amplifier 40. Typically, supply voltage $V_{SS}$ is ground.

The drain of MOSFET 44 forms the output for differential input stage 52, and is connected to the base of common-emitter amplifier transistor 56. The collector of transistor 56 drives an output stage 54 comprising complimentary transistors 66, 68, and diodes 62, 64. The emitters of transistors 66, 68 form a push-pull output 70 for operational amplifier 40 and diodes 62, 64 insure that one of transistors 66, 68 is always conducting.

A multiple output current mirror 78 provides quiescent current to DAM cell 10, differential input stage 52, and output stage 54 by means of FETs 24, 46, 48, according to a programming current through FET 50. The quiescent currents in DAM cell 10, differential input stage 52, and output stage 54 can be selected by varying the size of FETs 24, 46, and 48, respectively.

For well matched MOSFETs 42, 44, the voltage at output 70 with inverting input 72 and non-inverting input 74 shorted together should be mid-way between VDD and VSS. This midpoint voltage, $V_{th}$, is the balance point against which offsets are measured. Any mismatch between the device characteristics of MOSFETs 42, 44 will drive the voltage at output 70 towards one of the supply voltages $V_{DD}$ or $V_{SS}$. Such device mismatches are typical, and result from variations in the geometry of MOSFET devices. For example, if the gate of MOSFET 44 is thinner than that of MOSFET 42, output 70 will swing to $V_{SS}$ as current from current source 46 is directed preferentially through MOSFET 44. Device mismatches between MOSFETs 42, 44 of differential input stage 52 can be eliminated by measuring the offset between the voltage at output 70 and $V_{th}$ and applying voltages to node C or D based on the direction of the offset. This can be done manually or by means of a control circuit 80.

Control circuit 80 detects the voltage at output 70 and applies a voltage to one of injector nodes C, D according to the offset between the voltage at output 70 and a reference voltage when inverting input 72 and non-inverting input 74 are shorted together. For example, if output 70 swings to $V_{SS}$, control circuit 80 applies a positive tunneling voltage to node D. The resulting charge transfer to MOSFET 14 tends to turn it off, directing more current from current source 24 through MOSFET 12 at the expense of MOSFET 14. This increases the current flowing in the corresponding leg of current mirror 26, which increases the current flowing in the other leg of current mirror 26, robbing base current from transistor 56. As a result, transistor 56 begins to turn off output transistor 68 while turning on output transistor 66, swinging the voltage at output 70 away from $V_{SS}$. This charge injection process can be repeated until the voltage at output 70 rises above $V_{th}$. With the voltage at output 70 between VDD and Vth, tunneling voltage can be applied to the floating gate of MOSFET 12 by means of node C to adjust the voltage at output 70 back toward $V_{th}$. Such an adjustment process can be carried out by applying a fixed voltage to nodes C, D or by applying a voltage that decreases as the voltage at output 70 approaches $V_{th}$. In the latter case, the trimming process can be made very precise.

Figure 3:
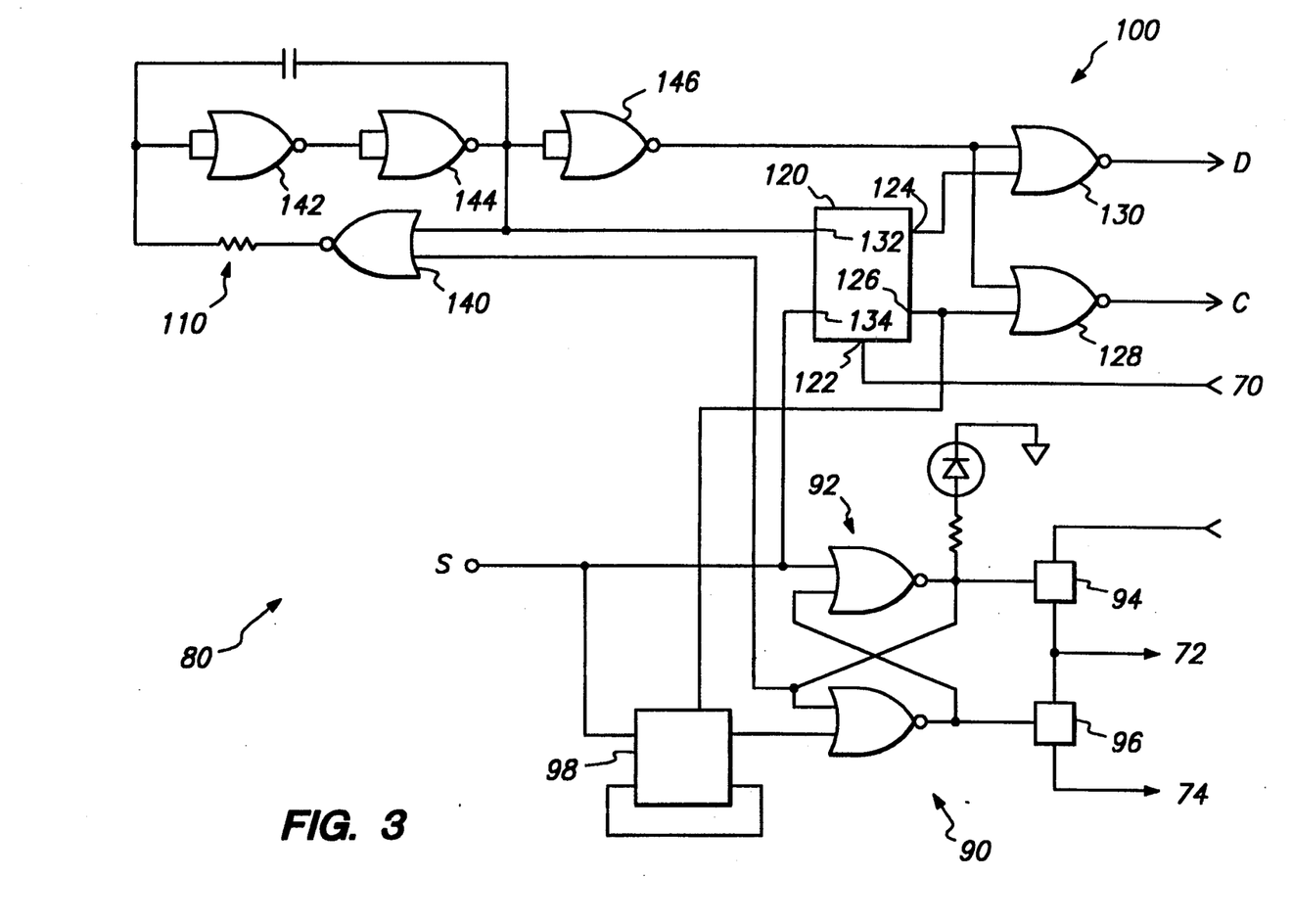
FIG. 3 is a schematic diagram of a control circuit for trimming the output of an operational amplifier including a DAM cell, to compensate for device mismatches in the differential input stage of the operational amplifier.

Referring now to FIG. 3, there is shown a schematic diagram of one embodiment of control circuit 80 for precisely adjusting the charge on the floating gates of MOSFETs 12, 14 of DAM cell 10. Although discussed in connection with operational amplifier 40, the method of the present invention is applicable to operational amplifiers in general. Control circuit 80 which may be external to the chip on which operational amplifier 40 is located, comprises an input switching circuit 90, an injector control circuit 100, and an oscillator 110.

Input switching circuit 90 includes a flip-flop 92, which is latched by toggle flip-flop 98 to open or close switches 94, 96. For example, when the voltage at start node S is brought to a high logic level, i.e. above $V_{th}$, the output of flip-flop 98 is at a low logic level. This opens switch 94 isolating inverting input 72 from input signals, and closes switch 96, connecting inverting input 72 to non-inverting input 74. The switch status is reversed when the voltage on output 70 crosses $V_{th}$.

Injector control circuit 100 includes a control flip-flop 120, having a clock input 132, a data input 122 which is connected to operational amplifier output 70, a reset input 134 which is connected to start node S, and a pair of complimentary outputs 124, 126 connected to NOR gates 128, 130, respectively. The outputs of NOR gates 128, 130 are connected to injector nodes C, D, respectively, to provide tunneling voltage to DAM cell MOSFETs 12 or 14, depending on the voltage at output 70 relative to $V_{th}$.

Oscillator 110 comprises NOR gate 140, the output of which is coupled back to one of its input by means of inverters 142, 144. The other input of NOR gate 140 is coupled to start node S. A third inverter 146 couples an inverted form of the output of oscillator 110 to the inputs of NOR gates 128, 130 of injector control circuit 100. An uninverted form of the output of oscillator 110 provides clocking pulses to injector control circuit 100 when it is enabled by a high logic voltage applied to start node S, i.e. when inverting input 72 and non-inverting input 74 are connected to each other. These clocking pulses are provided to control flip-flop 120 by means of clock input 132. Each high clocking pulse of oscillator 110 latches the voltage at data input 122 to complimentary outputs 124, 126, while a low pulse is simultaneously applied to one input of each of NOR gates 128, 130 through inverter 146, enabling them to respond to the voltage at outputs 124, 126. Thus, whichever of outputs 124, 126 is low sets the output of corresponding NOR gate 128, 130 high, providing a voltage pulse to injector node C or D, respectively. NOR gates 128, 130 are thus enabled or disabled depending on the offset of the voltage at output 70. When enabled, NOR gates 128, 130 couple a voltage from voltage supply 170 is coupled to corresponding node C, D, respectively, to adjust the output of DAM cell 10.

For example, when the voltage at output 70 is at $V_{DD}$, NOR gate 130 is disabled, while NOR gate 128 is enabled and couples the output of voltage source 170 to node C when the clock pulse is high. As the output of oscillator 110 goes low, NOR gates 128, 130 are both disabled and the new voltage at output 70 resulting from the application of the voltage pulse to node C is coupled to data input 122. On subsequent clock pulses, additional voltage pulses are applied to node C until the voltage at output 70 drops below $V_{th}$, at which point the logic levels at complimentary data outputs 124, 126 are reversed. As a result, NOR gate 128 is disabled, NOR gate 130 is enabled, and the next clock pulse provides a voltage pulse to injector node D. This last pulse pushes output 70 of operational amplifier 40 back toward $V_{th}$, the balance point of operational amplifier 40.

Figure 4:
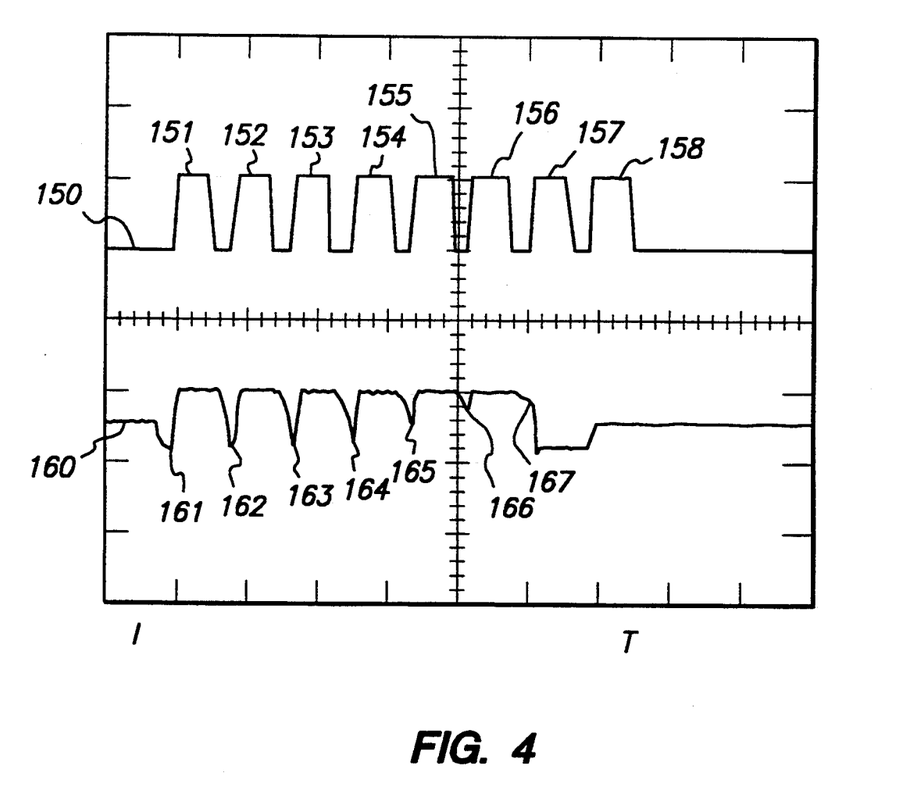
FIG. 4 is a diagram of the clock output and operational amplifier output as a function of time during a calibration cycle based on the method of the present invention.

Referring to FIG. 4, there are shown traces 150, 160 corresponding to clock pulses of oscillator 110 and output 70 of operational amplifier 40 during a trimming cycle initiated at point I and terminated at point T. Start pulse applied to start node S of control circuit 80 initiates the process, as described above. In this case, operational amplifier output 70 swings to $V_{SS}$ as indicated at point 161 when inverting input 72 and non-inverting input 74 are shorted. Consequently, on first clock pulse 151, NOR gate 130 is enabled, and a positive voltage pulse is applied to injector node D. The voltage at output 70 is sampled when clock pulse 151 goes low and as indicated by point 162 this voltage is still near supply voltage $V_{SS}$. Consequently, the next voltage pulse 152 is also applied to injector node D via NOR gate 130 with the resulting voltage at output 70 indicated at point 163. This process is repeated for pulses 153-156 with the voltages sensed at output 70 indicated by points 163-167. The voltage at output 70 following clock pulse 157 is not indicated on trace 160. However, following clock pulse 157 the voltage at output 70 has risen past $V_{th}$, and the logic levels at outputs 124, 126 are reversed for pulse 158. As a result, a voltage pulse is applied to injector node C on clock pulse 158 to bring the voltage at operational amplifier output 70 back toward $V_{th}$.

More refined trimming algorithms may also be applied in conjunction with control circuit 0. For example, powering NOR gates 128, 130 with a voltage source 170 having an output voltage controlled by the difference between the voltage at output 70 and $V_{th}$ allows the tunneling voltages applied to nodes C, D to be reduced as the offset is eliminated. In this way, the residual offset between the voltage at output 70 and $V_{th}$ can be made smaller without substantially increasing the time necessary to trim operational amplifier 40. One such adjustable voltage source 170 is a charge pump circuit.

Therefore, an analog memory cell is presented in accordance with the present invention, that uses differentially-connected, floating gate MOSFETs to provide precisely adjustable analog voltages having reduced voltage drift. The differential structure allows these voltage levels to be increased or decreased with voltage pulses having the same polarity, eliminating complications due to polarity dependencies in the current-voltage characteristics of the charge injectors. A method for precisely adjusting the charge on the differential analog memory cell is also presented, along with a circuit for implementing this method.

What is claimed is:

1. A differential analog memory cell for precisely correcting offsets and adjusting bias levels in a circuit, the differential analog memory cell comprising:
    a pair of differentially connected MOSFETs, each MOSFET having a floating gate, a drain, and a source, the sources of each MOSFETs being connected to the other and to a current source, and the drains of the MOSFETs forming a pair of current outputs for the differential analog memory cell;
    a pair of coupling capacitors, each having one electrode connected to the floating gate of one of the MOSFETs, and another electrode connected to a reference voltage, for establishing a gate voltage on the floating gates according to charges on the floating gate; and
    means for injecting charges onto the floating gates of each MOSFET for distributing current from the current source between the drains of the MOSFETs according to the relative amount of charge injected onto the floating gates of the MOSFETs.

2. The differential analog memory cell of claim 2, wherein the drain of each differentially connected MOSFETs is coupled to one leg of a current mirror, to form a differential amplifier.

3. The differential analog memory cell of claim 2, wherein the MOSFETs are NMOS devices.

4. The differential analog memory cell of claim 3, wherein the MOSFETs are PMOS devices.

5. The differential analog memory cell of claim 4, wherein the charge injector means is a pair of tunneling capacitors each having one electrode coupled to the floating gate of one of the MOSFETs and the other electrode coupled to an injection voltage source, for injecting charges onto the floating gate of each of the MOSFETs by adjusting the output of the corresponding injection voltage source to induce tunneling.

6. The differential analog memory cell of claim 4, wherein the charge injector means is a pair of MOSFETs, each having its gate connected to the floating gate of one of the differentially connected MOSFETs, its source connected to a reference voltage, and its drain connected to an injection voltage source, for injecting charges onto the floating gate of each of the MOSFETs by adjusting the output of the corresponding injection voltage source to induce avalanche injection.

7. An operational amplifier having a differential analog memory cell adjustable through a pair of voltage inputs for correcting the offset of the amplifier output voltage, the operational amplifier comprising:
    a differential input stage having a current input, first and second current outputs connected to the input and output, respectively, of a current mirror, and inverting and non-inverting inputs, for distributing the current from the current input between the first and second current outputs according to the voltage difference between the inverting and non-inverting inputs;
    an output buffer having a current input, a signal input connected to one of the current outputs of the differential input stage, and an output forming the output of the operational amplifier, for coupling a signal from the differential input stage to the amplifier output;
    a differential analog memory cell having first and second floating gate MOSFETs, the first and second floating gate MOSFETs having their drains connected to the input and output, respectively, of the current mirror in parallel with the first and second current outputs of the differential input stage, and their sources connected to a common current source, coupling capacitors to connect the floating gates of the first and second MOSFETs to a reference voltage, and means for injecting charge onto each floating gate, for adjusting the current at the input and output of the current mirror by injecting charges onto the floating gates of the first and second MOSFETs; and
    a control circuit having a first input for receiving an initiation signal, a pair of outputs connected to the inverting and non-inverting inputs of the operational amplifier, and a pair of outputs connected to the charge injection means of the differential analog memory cell, the control circuit selectively connecting the inverting and non-inverting inputs of the differential stage together on receipt of an initiation signal, and repeatedly sensing the voltage at the output of the operational amplifier to activate one of the charge injecting means depending on the difference between the output voltage and a reference voltage, to correct the offset in the output voltage.

8. The operational amplifier of claim 7, wherein the charge injecting means is a pair of tunneling capacitors, each having one electrode coupled to the floating gate of one of the first and second MOSFETs and the other electrode coupled to an injection voltage source, for injecting charges onto the floating gates of the first and second floating gate MOSFETs by adjusting the output of the corresponding injection voltage source to induce tunneling.

9. The operational amplifier of claim 8, wherein the control circuit comprises:

an input switching circuit having a first input for receiving an initiation signal, a second input for receiving a reset signal, a first switch connected between the inverting and non-inverting inputs of the operational amplifier, and a second switch connected between the inverting input and its signal source, the switching circuit being effective to close the first switch between the inverting and non-inverting inputs and to open second switch between the non-inverting input and its signal source in response to an initiation signal applied to the first input, and to reverse these switches in response to a reset signal applied to the reset input;

an injector control circuit having a clock input for receiving a clocking pulse, a data input coupled to the output of the operational amplifier, and a pair of outputs for coupling the injection voltage source to the tunneling capacitors of the differential memory cell, the injector control circuit being effective to couple the injector voltage source to a selected tunneling capacitors in response to the difference between the voltage at the data input and a reference voltage when the clock input is high, and to couple the resulting voltage at the operational amplifier output to the data input when the clock input is low; and an oscillator circuit having an enable input and an output for providing clock pulses to the injector control circuit when the initiation signal is received on the enable input, for applying voltage pulses from the injector voltage source to the tunneling capacitor of the differential analog memory cell according to the output of the operational amplifier circuit, for correcting the offset between the output voltage and a reference voltage.

10. The operational amplifier of claim 9, wherein the voltage provided by the injector voltage source decreases as the difference between the output voltage of the operational amplifier and the reference voltage is decreased.

11. The operational amplifier of claim 10, wherein the injector voltage source is a charge pump circuit.

12. A method for precisely adjusting the charge on a differential analog cell comprising differentially connected floating gate MOSFETs, the method comprising the steps of:

sensing the voltage at the output of the differential analog memory cell;

generating a series of voltage pulses for application to the floating gate of a selected MOSFETs in response to the difference between the voltage at the output of the differential analog memory cell and a reference voltage, until the difference between the voltage at the output of the differential analog memory cell and the reference voltage reverses polarity; and applying a voltage pulse to floating gate of the other MOSFET, to adjust the output of the differential analog memory cell back toward the reference voltage.

13. The method of claim 12, wherein the voltage pulses applied to the floating gates of the MOSFETs are of equal size.

14. The method of claim 12, wherein the voltage of the pulses applied to the floating gates of the MOSFET decreases as the difference between the output voltage and the reference voltage decreases.

15. The method of claim 12, wherein the voltage of the output of the differential analog memory cell is sensed by connecting the differential analog memory cell as a second differential input stage in parallel with the differential input stage of an operational amplifier, and measuring the voltage at the output of the operational amplifier.

* * * * *